United States Patent
Zhang

[11] Patent Number: 6,154,641
[45] Date of Patent: Nov. 28, 2000

[54] WIDEBAND MULTIPLE CHANNEL FREQUENCY CONVERTER

[75] Inventor: Zexiang Zhang, Lake Parsippany, N.J.

[73] Assignee: Lucent Technologies Inc., Murray Hill, N.J.

[21] Appl. No.: 09/179,572

[22] Filed: Oct. 27, 1998

[51] Int. Cl.[7] .................................................. H03F 1/26
[52] U.S. Cl. .................. 455/112; 455/114; 455/117; 455/118; 455/119; 455/323; 375/296; 330/149; 330/151
[58] Field of Search .................................. 455/112, 114, 455/117, 118, 119, 296, 310; 375/296; 330/149, 151

[56] References Cited

U.S. PATENT DOCUMENTS

| | | | |
|---|---|---|---|
| 5,033,110 | 7/1991 | Harman | 455/114 |
| 5,528,196 | 6/1996 | Baskin et al. | 330/151 |
| 5,768,699 | 6/1998 | Behan et al. | 455/296 |
| 5,877,653 | 3/1999 | Kim et al. | 330/149 |

*Primary Examiner*—Dwayne D. Bost
*Assistant Examiner*—Temica M. Davis
*Attorney, Agent, or Firm*—Mayer, Fortkorta & Williams; Karin L. Williams

[57] ABSTRACT

A wideband multiple channel frequency converter includes a mixer, a frequency generator for generating a local oscillator signal, a power divider for receiving the local oscillator signal and providing a portion of the signal to the mixer and a portion of the signal to a feed forward path which phase and amplitude adjusts the signal and a power combiner for receiving and combining a signal from the mixer and the phase and amplitude adjusted signal from the feed forward path. In addition, an attenuator may be implemented to reduce a power level of a signal to be converted and a band-pass filter may receive the signal from the power combiner. The converter compensates for local oscillator signal leakage and can reduce inter-modulation components.

20 Claims, 2 Drawing Sheets

WIDEBAND MULTIPLE CHANNEL FREQUENCY CONVERTER

FIELD OF THE INVENTION

The present invention relates generally to a wideband multiple channel frequency converter. More particularly, the present invention relates to a wideband multiple channel frequency converter which can compensate for local oscillator signal leakage and which can reduce inter-modulation components.

BACKGROUND OF THE INVENTION

A wideband multiple channel frequency converter is particularly useful in the field of wireless communication technology, and in fact, is particularly useful in wireless base station systems. In the current expanding wireless communication environment, systems require both high data rates and high processing gains. Wideband transceivers are essential to realize these features demanded by wireless communication systems. In fact, it is believed that the next generation of wireless transceivers, for both multimedia applications and for wireless networking, must be wideband systems.

In addition, a large variety of digital systems have recently emerged in the wireless market. To combine the emerging digital systems with existing analog systems, and to reduce the cost of a wireless system, a new technology, i.e., a wideband software-defined radio base station system, is developing. Essentially, in a software-defined radio base station transmitter, digital base-band channels are processed separately. All channels are then combined together, and the combined signal (i.e., a wideband multiple channel signal), after a digital to analog conversion, is then up-converted to RF by a wideband multiple channel frequency converter In some cases however, a second intermediate up-conversion stage may also be required to up-convert the signal to RF.

A wideband multiple channel frequency converter with very low inter-modulation components (for example, −60 dBc or even lower) is essential to realize such a wideband multiple channel transceiver. Thus, it would be beneficial to develop a system for realizing a wideband multiple channel frequency converter with improved performance, with low inter-modulation components and wherein only desired signals are output from the converter.

Consider the following situation for a frequency up-converter (it should be noted that while the discussion below is focused on a frequency up-converter, it will appreciated that the discussion is equally applicable to down-converters.). A wideband multiple channel intermediate frequency (IF) signal is input to an up-converter. The performance requires an up-converted RF signal at the output port of the converter, with low inter-modulation components which will allow a band-pass filter to easily filter out the undesired components from the output signal. In analyzing the response of the up-converter to the input wideband signal, two line signals are illustrated in FIG. 1 to represent the wideband signal.

A conventional implementation of a frequency converter utilizes a mixer. Considering a wideband signal, i.e., two line signals $f_1$ and $f_2$, input to the mixer, the local oscillator signal (LO) is $f_0$, and following condition is satisfied:

$$f_0 >> f_2, f_1 >> (f_2-f_1)(f_2 > f_1 \text{ assumed})$$

resulting in a simplified output frequency spectrum of a conventional frequency converter, as shown in FIG. 1 (note that FIG. 1 shows only the components containing $f_0$ and neglects those components containing $2f_0$, $3f_0$...). In FIG. 1 we see that there are many inter-modulation components, together with a possible local oscillator (LO) leakage signal. The only signals desired to be output from the frequency converter are $(f_0+f_1)$ and $(f_0+f_2)$ (considering the "up branch", for example).

Traditional technologies have not solved the inter-modulation (e.g., $f_0-4f_2+3f_1$, $f_0-3f_2+2f_1$, etc.) and local oscillator (LO) signal ($f_0$) leakage problems illustrated in FIG. 1. Although it may be known that inter-modulation components can be reduced by reducing the power level input to a mixer for wideband mixers, there is typically local oscillator (LO) signal leakage to the output RF port, and, if the power level of an input signal is reduced to a low level, the local oscillator (LO) leakage at the RF port may be even higher than the desired output RF signal.

An example of such an occurrence is illustrated with respect to the conventional M/A-COM wideband mixer MD-123 PIN, the parameters of which are listed below:

Frequency range: RF, LO: 0.01–3 GHz IF: 0.01–3 GHz

Typical two-tone IM ratio: −56 dBc when each tone is −10 dBm at the input

Conversion loss: 8 dB

LO power needed: 10 dBm min

Isolation: LO to RF: 25 dB; LO to IF: 25 dB; RF to IF 25 dB

As noted in the discussion above, inter-modulation components may typically be reduced by reducing the power level input to the mixer. For example, if the input signal power to the MD-123 PIN is reduced to −12 dBm, the inter-modulation components will be reduced sufficiently to −60 dBc. However, the desired signal output at the RF port will be −20 dBm, and the local oscillator LO leakage at the RF port will be −15 dBm (i.e., the local oscillator (LO) leakage is actually 5 dB higher than the desired RF signal).

The present invention is therefore directed to the problem of developing a wideband multiple channel frequency converter which allows only the desired signals to be converted and output, and which rejects or significantly reduces other unwanted components, including both inter-modulation components and local oscillator leak components.

SUMMARY OF THE INVENTION

The invention solves the problems discussed above by providing a wideband multiple channel frequency converter in which the oscillator leakage signal is canceled, and in which unwanted inter-modulation components and harmonics can be suppressed to a very low level, for example −60 dBc or lower, relative to the desired signal. In addition, it is desirable to have a converter in which the IF/RF ratio can be reduced, thereby making a lower input IF frequency acceptable, while still providing a suitable band-pass filter.

In one particular embodiment, the present invention provides a wideband multiple channel frequency converter capable of canceling local oscillator (LO) leakage components. The converter includes a mixer, having a first input for receiving a signal to be converted and a second input for receiving a local oscillator signal, a frequency generator for generating a local oscillator signal and a power divider for receiving the local oscillator signal and providing a portion of the local oscillator signal to the second input of the mixer and a portion of the local oscillator signal to a feed forward path. The feed forward path phase adjusts the signal received from the power divider, a power combiner receives and combines a signal output from the mixer and the phase-adjusted signal output from the feed forward path. Finally, a band-pass filter receives the signal output from the power combiner and rejects unwanted modulated components.

In another aspect of the invention, the power level of the signal to be converted may be reduced by an attenuator and coupled to the first input of the mixer, thereby reducing inter-modulation components.

In a particular embodiment, the feed forward path includes an attenuator for reducing a power level of the signal received (i.e. adjusting the amplitude of the signal received) from the power divider and a phase shifter for phase shifting the signal from the attenuator. In still a further embodiment, the feed forward path further includes isolator means, coupled between an output of the phase shifter and an input of the power combiner, for preventing reverse coupling of the signal.

These and other advantages of the invention will be apparent to those of ordinary skill in the art by reference to the following detailed description and the accompanying drawings. It is to be understood that both the foregoing summary and the following detailed description are exemplary and are not restrictive of the invention as claimed.

DETAILED DESCRIPTION

A wideband multiple channel frequency converter typically contains a local oscillator (LO) leakage signal that does not contain information and degrades the signal quality. However, conventional converters do not include any means for eliminating the undesired LO leakage signal. Accordingly, one aspect of a wideband multiple channel frequency converter according to a first embodiment of the present invention cancels a local oscillator (LO) leakage signal from an output signal by taking a part of the local oscillator (LO) sample signal power and phase adjusting the signal. The converter then couples this phase adjusted local oscillator (LO) signal forward to the output port of the mixer so as to cancel the undesired local oscillator (LO) leakage signal from the output signal.

Figure 1:
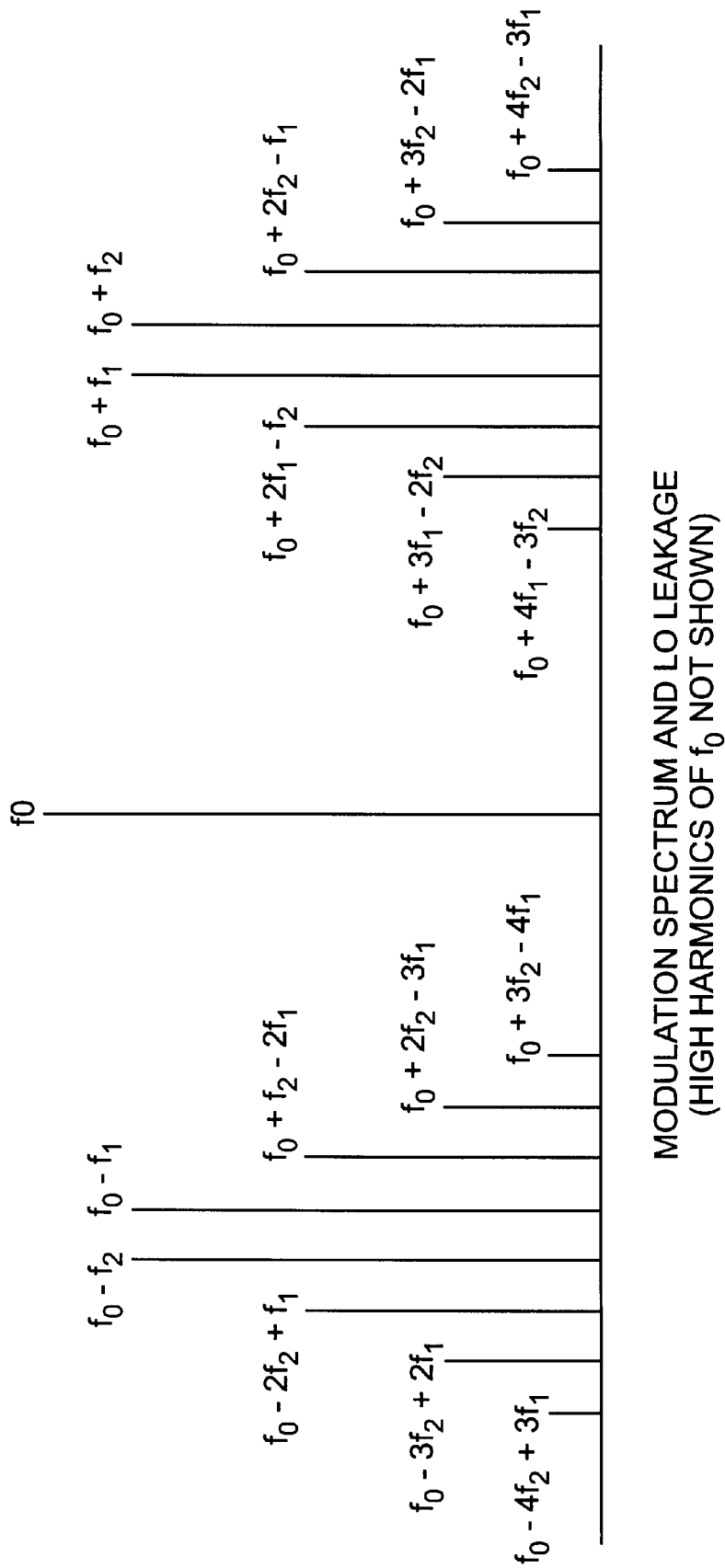
FIG. 1 is an illustration of the modulation spectrum and local oscillator LO leakage signal output of a conventional frequency converter.
Figure 2:
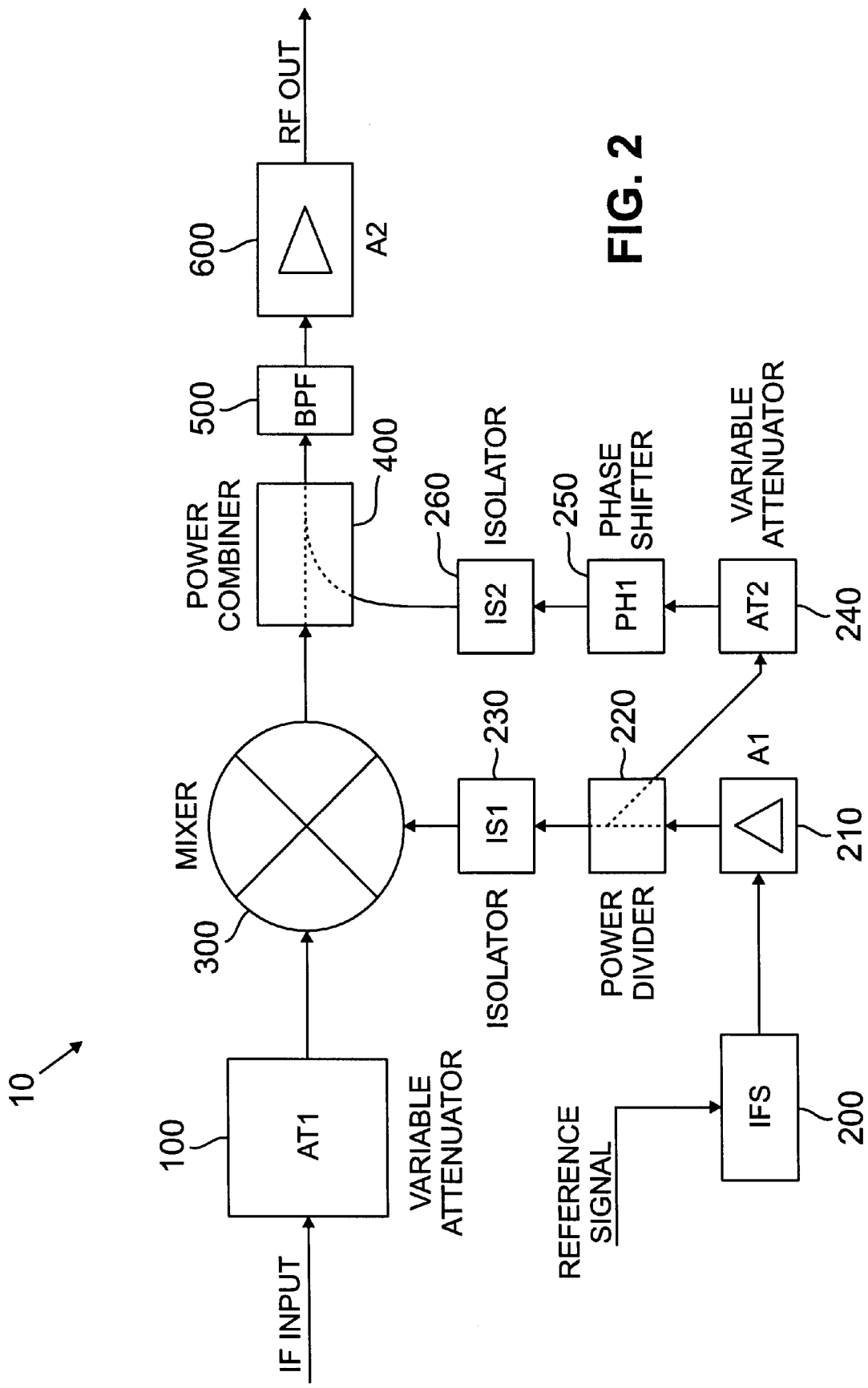
FIG. 2 is a block diagram showing a wideband multiple carrier frequency converter configured in accordance with the principles of the present invention.

A specific wide band multiple channel frequency converter 10 constructed in accordance with a preferred embodiment of present invention will now be described, referring to FIG. 2, which is a specific implementation of the invention.

The local oscillator (LO) signal is supplied by integrated frequency synthesizer (IFS) module 200, which may include a phase locked synthesizer, a low pass filter, and an voltage controlled oscillator (VCO). The output of IFS module 200 must have a very low phase noise, typically for example, −85 dBc/Hz at 1 kHz off. This requirement can be reached by using a low phase noise VCO and a very low phase noise reference signal (typically for example, −105 dBc/Hz at 1 kHz off, or better). The reference source for IFS module 200 may be, for example, a temperature compensated crystal oscillator (TCXO) with a temperature stability of +/−1 ppm (or better).

The output of IFS module 200 is then amplified by linear amplifier A1 210, to supply sufficient power to mixer 300 and to the feed forward path. In addition, amplifier A1 210 provides isolation and a good impedance match between the VCO of IFS 200 and mixer 300. The amplified LO power is then power divided by power divider 220. One branch of output of power divider 220 is then input to isolator 230, which is provided between power divider 220 and mixer 300 to further reject the reverse coupling of RF to LO leakage of the mixer to the feed-forward path. Mixer 300 is a wideband mixer, covering from the low MHz range to 2500 MHz, thus producing a converter 10 that is usable for most wireless communication applications.

Another branch output from power divider 220 is fed forward to attenuator AT2 240, which is a variable attenuator. The output of attenuator AT2 240 is then fed to phase shifter PH1 250 in the feed forward path. Phase shifter PH1 250 is a narrow-band phase shifter in the RF frequency range, and phase shifts the local oscillator leakage signal. A second isolator IS2 260 is also in the feed-forward path between power combiner 400 and phase shifter PH1 250 and acts to reject reverse signal flow. Power combiner 400 combines the feed-forward signal, which is the attenuated phase-shifted local oscillator signal, and the immediate output signal from mixer 300, which contains the local oscillator leakage signal. Power combiner 400 thereby acts to combine the two signals, in which the two LO components are phase-shifted by 180 degrees to each other, and with the same amplitude, thereby eliminating the signal from the output.

A second aspect of a wideband multiple channel frequency converter according to a first embodiment of the present invention, which may be provided with the first aspect described above, reduces unwanted inter-modulation components by providing a wideband multiple channel frequency converter which works in a low signal level status. In particular, a high input level signal can be reduced, for example, by using an attenuator, and the power level of the input signal can continue to be reduced until the inter-modulation components reach a desired or acceptable level.

Specifically, again referring to FIG. 2, the IF input port of converter 10 is connected to attenuator AT1 100. The function of attenuator AT1 100 is to reduce the input IF signal to a lower level that produces inter-modulation components at the output of converter 10 that are sufficiently reduced. In a particular example, reducing two input signals f1 and f2 by X dB each, causes the third order inter-modulation components, $f_0+2f_1-f_2$, and $f_0+2f_2-f_1$, to be reduced by 3X dB, while the desired signal is reduced only X dB. As a result, a net 20 dB third order inter-modulation suppression is obtained by reducing the input signal level by 10 dB each. Similarly, the lesser "second" order inter-modulation components will be reduced 2X dB. A detailed explanation illustrating this "third order intercept" principle, including a numerical example, is provided in the RF/IF Designer's Handbook by Mini-Circuits, DH-97, page 1–5.

Referring to FIG. 2 again, in a preferred embodiment of the invention, in order to increase the dynamic range of converter 10, attenuator AT1 100 is a variable attenuator. Again, it is understood in the art that in an alternative embodiment, attenuator 100 can be replaced by an AGC (automatic gain control) block, without departing from the spirit and scope of the invention. It should also be noted that for implementation of the frequency converter 10 in a receiver, where the input signal is already very weak, attenuator AT1 100 may not be necessary.

Finally, a third aspect of a wideband multiple channel frequency converter according to a first embodiment of the present invention provides a converter which allows for reducing the frequency conversion IF/RF ratio while still providing that a band-pass filter is available to reject the lower branch (or upper branch) of the modulated spectrum, i.e., one side branch of the modulated spectrum can be rejected by a suitable band pass filter (which is connected to the output port of the converter) with a steep edge and a high out-of-band rejection. The band-pass filter further serves to reject the modulation components related to the high harmonics of the local oscillator (LO). In addition, if the destination RF frequency can not be reached by one conversion stage, another up conversion stage may be added.

More particularly, because the local oscillator LO leakage is essentially canceled (based on the phase-adjusted signal fed forward), the IF/RF ratio can be further reduced by approximately 50%, in comparison to a conventional frequency converter without local oscillator (LO) leakage cancellation, implementing the same band-pass filter. This feature provides the advantage of a low acceptable IF/RF ratio.

The following example further explains the benefits of reducing the IF/RF ratio by suppressing the LO leakage signal. First, assume that a RF frequency of 2000 MHz (the output frequency of the converter) is required, and that both the LO and IF frequency are selectable. Also assume that a band pass filter (BPF) is selected that has an insertion loss of 10 dB and a 40 dB rejection bandwidth 6% of its central frequency. If the LO leakage signal is not suppressed by the frequency converter, the BPF must be able to reject both LO leakage signal and LO-IF. It follows that:

$$(LO+IF-LO)/(IF+LO)=0.03$$

Since IF+LO=2000 MHz (the RF output frequency), we obtain from the above equation, IF=60 MHz and LO=1940 MHz, IF/RF=0.03. However, when the LO leakage signal is suppressed by the frequency converter, the BPF needs to reject only LO-IF (i.e., it does not need to reject the LO leakage signal). Therefore, it follows that:

$$((LO+IF)-(LO-IF))/(IF+LO)=0.03.$$

Again, since IF+LO=2000 MHz (the RF output frequency), we obtain from the above equation, LO=1970 MHz and IF=30 MHz, IF/RF=0.015.

This example illustrates the advantage of suppressing the LO leakage signal, i.e., it reduces the IF frequency required in a converter that suppresses the LO leakage signal to 50% (i.e., 30 MHz in the example) of the IF frequency required in a converter that does not provide LO leakage signal suppression (i.e., 60 MHz in the example). Obviously this also reduces the IF/RF ratio to 50% of the ratio without LO leakage signal cancellation (i.e., 0.015 in the example).

Accordingly, a frequency converter according to one embodiment of the present invention allows for reducing the frequency conversion IF/RF ratio based on the selection of a suitable band-pass filter, connected to the output port of the converter and having a steep edge and a high out-of-band rejection, to reject one branch of the modulated spectrum. A suitable band-pass filter is typically available when the IF/RF ratio is larger than 0.02. The band-pass filter further serves to reject the modulation components related to the high harmonics of the local oscillator (LO). Accordingly, the lowest possible IF frequency may be selected to comply with other linearization applications.

Returning to FIG. 2, band-pass filter 500 receives the output signal from power combiner 400 and rejects the modulation components at the unwanted side and signals related to the high harmonics of the local oscillator (LO). For example, in a preferred embodiment of the invention, band-pass filter 500 may be a ceramic filter with at least 5 sections and should have a steep edge (wherein 3 dB bandwidth is about 2% of the central frequency and −60 dB bandwidth is about 4% of the central frequency).

Finally, to recover the signal power, linear amplifier chain A2 600 follows band-pass filter 500, and is used in a large back-off status to maintain its linearity.

A design example of a frequency converter constructed in accordance with the principles of the invention is given below to illustrate the principles of the present invention. This example is provided only for illustrative purposes and is no limitation on the scope of the invention.

IF Input: 40–60 MHz, −60 dBm to 10 dBm

RF Output: 2160–2180 MHz, −60 dBm to 10 dBm

Attenuator AT1 (100): LORCH VA-V-10/100-3, 0 to 50 dB attenuation, 10–100 MHz range Mixer (300): M/A-COM MD123 PIN, LO drive power 10 dBm, conversion loss 8 dB, $IM_s$−60 dBc for input at −12 dBm IFS (200): SYNERGY SPLHR2050SAO, output 10 dBm, phase noise −87 dBc/Hz at 10 kHz off, frequency range 2050 MHz to 2600 MHz Amplifier A1 (210): RF 2307, Gain 15 dB, $P_{1dB}$ 14 dBm, IP3: 24 dBm Power divider (220): Winkinson strip line power divider Attenuator AT2 (240): composed of a −20 dB resistor pad and a variable attenuator—a LORCH MICROWAVE VA-V-1900/2300-4A (0–15 dB)

Phase shifter PH1 (250): LORCH MICROWAVE phase shifter VP-180-1900/2300-4A, frequency range: 1900–2300 MHz, phase shift range 0–180°, input power 10 dBm max., insertion loss 3 dB max., surface mount Isolator IS1 and IS2 (230 and 260, respectively): muRata CEO732R14DCB, 2110–2170 MHz Power combiner (400): Winkinson strip line power combiner BPF (500): Lark Engineering 3SD2170-40-7CC, 3 dB bandwidth 40 MHz, insertion loss 9.4 dB amplifier A2 (600): a two stage amplifier chain.
  The first amplifier: RF2128P, gain 25 dB, IP3: 29 dBm
  The second amplifier: MPS213011-86, gain 14 dB, IP3: 45 dBm Accordingly, as described above in the example illustrative embodiment, a wideband multiple channel frequency converter according to the present invention converts an input frequency signal into a desired frequency signal having low inter-modulation components and a low local oscillator signal leakage signal.

Although the invention has been described and illustrated with a certain degree of particularity, it is understood that the present disclosure has been made only by way of example, and that numerous component changes could be made by those skilled in the art without departing from the spirit and scope of the invention as claimed below.

What is claimed is:

1. A wideband multiple channel frequency converter comprising:

a mixer, having a first input for receiving a signal to be converted and a second input for receiving a local oscillator signal;

a frequency generator for generating a local oscillator signal;

a power divider for receiving the local oscillator signal, providing a portion of the local oscillator signal to the second input of said mixer and providing a portion of the local oscillator signal to a feed forward path;

a feed forward path for phase and amplitude adjusting the signal received from said power divider;

a power combiner for receiving and combining a signal output from said mixer and a phase and amplitude adjusted signal output from said feed forward path.

2. A wideband multiple channel frequency converter according to claim 1 further comprising:

a band-pass filter for receiving a signal output from said power combiner and for rejecting unwanted modulated components; and first amplifier means for amplifying a signal output from said band-pass filter.

3. A wideband multiple channel frequency converter according to claim 1, further comprising attenuator means for receiving the signal to be converted and reducing a power level of the signal to be converted, wherein an output signal from said attenuator is coupled to the first input of said mixer.

4. A wideband multiple channel frequency converter according to claim 3, wherein said attenuator means comprises a variable attenuator.

5. A wideband multiple channel frequency converter according to claim 1, further comprising second amplifier means for amplifying the local oscillator signal output from said frequency generating means, wherein the amplified local oscillator signal output from said second amplifier means is provided to said power divider.

6. A wideband multiple channel frequency converter according to claim 1, further comprising isolator means coupled between an output of said power divider and the second input of said mixer for preventing reverse coupling of signals from said mixer to said power divider.

7. A wideband multiple channel frequency converter according to claim 1, wherein said frequency generating means is a crystal oscillator.

8. A wideband multiple channel frequency converter according to claim 1, wherein said frequency generating means is a frequency synthesizer.

9. A wideband multiple channel frequency converter according to claim 7, wherein said frequency synthesizer is an integrated frequency synthesizer.

10. A wideband multiple channel frequency converter according to claim 8, wherein said integrated frequency synthesizer comprises a low phase noise voltage-controlled oscillator, a low pass filter and a phase-locked synthesizer.

11. A wideband multiple channel frequency converter according to claim 1, wherein said feed forward path comprises:

attenuator means for reducing a power level of the signal received from said power divider; and phase shifting means for phase shifting a signal from said attenuator means.

12. A wideband multiple channel frequency converter according to claim 11, wherein said attenuator means is a variable attenuator.

13. A wideband multiple channel frequency converter according to claim 11, wherein said feed forward path further comprises isolator means, coupled between an output of said phase shifting means and an input of said power combiner, for preventing reverse coupling of the signal from said power combiner to said phase shifting means.

14. A wideband multiple channel frequency converter according to claim 2, wherein said first amplifier means is a multiple stage amplifier chain.

15. A wideband multiple channel frequency converter according to claim 1, wherein said power divider is a Winkinson-type strip line power divider and said power combiner is a Winkinson-type strip line power combiner.

16. A wideband multiple channel frequency converter according to claim 1, wherein said power divider provides approximately one half of the local oscillator signal to the second input of said mixer and provides approximately one half of the local oscillator signal to the feed forward path.

17. A wideband multiple channel frequency converter according to claim 2, wherein an IF/RF ration is reduced for a given selected band-pass filter.

18. A wideband multiple channel frequency converter according to claim 17, wherein the IF/RF ration reduction is based on the cancellation of the LO leakage from the output of said mixer through said feed forward path.

19. A wideband multiple channel frequency converter according to claim 18, wherein the IF/RF ratio is such that the bandpass filter may reject one branch of a modulated spectrum.

20. A wideband multiple channel frequency converter capable of reducing inter-modulation components and local oscillator (LO) leakage components, comprising:

(a) a variable attenuator for receiving an input signal and reducing a power level of the input signal;

(b) a mixer for receiving a signal output from said variable attenuator;

(c) an integrated frequency synthesizer for providing a local oscillator signal;

(d) a linear amplifier for amplifying the local oscillator signal output from said integrated frequency synthesizer;

(e) a power divider for receiving a signal output from said linear amplifier and providing a first output signal and a second output signal;

(f) a first isolator for coupling the first output signal to said mixer and for preventing reverse coupling of signals from said mixer to said power divider;

(g) a variable attenuator, coupled to said power divider, for reducing a power level of the second output signal from said power divider;

(h) a phase shifter for phase adjusting a signal output from said variable attenuator;

(i) a second isolator for coupling an output from said phase shifter to a power combiner and for preventing reverse coupling of signals from said power combiner to said phase shifter;

(j) a power combiner for receiving and combining a signal output from said mixer and a signal output from said second isolator;

(k) a band-pass filter for receiving a signal output from said power combiner and for rejecting unwanted modulated components; and (l) a linear amplifier for amplifying a signal output from said band-pass filter.

* * * * *